(12) United States Patent
Waugh et al.

(10) Patent No.: US 10,014,163 B2
(45) Date of Patent: Jul. 3, 2018

(54) APPLICATION OF COATING MATERIALS

(75) Inventors: Allen Robert Waugh, Burgess Hill (GB); Gareth William Hall, Kingston on Soar (GB); Steven Antony Stanley, Chester (GB)

(73) Assignee: Vision Ease, LP, Ramsey, MN (US)

( * ) Notice: Subject to any disclaimer, the term of this patent is extended or adjusted under 35 U.S.C. 154(b) by 657 days.

(21) Appl. No.: 14/123,942

(22) PCT Filed: Jun. 7, 2012

(86) PCT No.: PCT/GB2012/051277
§ 371 (c)(1),
(2), (4) Date: Jan. 23, 2014

(87) PCT Pub. No.: WO2012/168709
PCT Pub. Date: Dec. 13, 2012

(65) Prior Publication Data
US 2014/0174912 A1    Jun. 26, 2014

(30) Foreign Application Priority Data

Jun. 7, 2011    (GB) .................................... 1109479.4
Mar. 26, 2012    (GB) .................................... 1205220.5

(51) Int. Cl.
*C23C 14/00*    (2006.01)
*H01J 37/34*    (2006.01)
(Continued)

(52) U.S. Cl.
CPC .......... *H01J 37/3405* (2013.01); *C23C 14/08* (2013.01); *C23C 14/14* (2013.01);
(Continued)

(58) Field of Classification Search
CPC .................................................... H01J 37/3411
See application file for complete search history.

(56) References Cited

U.S. PATENT DOCUMENTS 4,817,559 A    4/1989    Ciparisso
5,427,671 A    6/1995    Ahmed
(Continued)

FOREIGN PATENT DOCUMENTS

EP    0567501 B1    8/1998
EP    0714454 B1    12/1998
(Continued)

OTHER PUBLICATIONS

Deposition of Multilayer Optical Coatings Using Closed Field Magnetron Sputtering, Gibson et al., Jan. 1, 2006.
(Continued)

*Primary Examiner* — Timon Wanga
(74) *Attorney, Agent, or Firm* — Inskeep IP Group, Inc.

(57) ABSTRACT

The invention relates to apparatus and a method for applying coatings to substrates such as, for example, a lens or electronic component. The apparatus includes a coating chamber in which there is provided one or more magnetrons which include, typically, an at least partially oxidized metal or metal alloy. A carrier is provided for the substrates to be moved and held in the coating chamber and the carrier is formed from a plurality of units on which the substrates are positioned and the units can be brought together to form the carrier.

23 Claims, 7 Drawing Sheets

(51) Int. Cl.
    H01J 37/32    (2006.01)
    H01L 21/67    (2006.01)
    C23C 14/35    (2006.01)
    C23C 14/50    (2006.01)
    C23C 14/56    (2006.01)
    C23C 14/08    (2006.01)
    C23C 14/14    (2006.01)

(52) U.S. Cl.
    CPC .......... *C23C 14/35* (2013.01); *C23C 14/352* (2013.01); *C23C 14/505* (2013.01); *C23C 14/566* (2013.01); *H01J 37/32779* (2013.01); *H01L 21/6719* (2013.01)

(56) References Cited

U.S. PATENT DOCUMENTS

| | | | |
|---|---|---|---|
| 5,660,693 | A | 8/1997 | Abramson et al. |
| 5,753,092 | A * | 5/1998 | Hollars ............ C23C 14/56 118/719 |
| 5,798,027 | A * | 8/1998 | Lefebvre ............ C23C 8/02 204/192.26 |
| 6,090,247 | A | 7/2000 | White et al. |
| 6,090,248 | A | 7/2000 | White et al. |
| 6,143,143 | A | 11/2000 | Walls et al. |
| 6,159,351 | A | 12/2000 | J'Afer et al. |
| 6,171,462 | B1 | 1/2001 | Gries et al. |
| 6,346,176 | B1 | 2/2002 | Hughes |
| 6,572,738 | B1 | 6/2003 | Zueger |
| 6,635,155 | B2 | 10/2003 | Miyamura et al. |
| 6,878,243 | B2 | 8/2005 | Breme |
| 7,179,352 | B2 | 2/2007 | Zueger |
| 7,916,407 | B2 | 3/2011 | Meschenmoser et al. |
| 2002/0023837 | A1* | 2/2002 | Stimson ............ C23C 14/345 204/298.18 |
| 2004/0026240 | A1* | 2/2004 | Shidoji ............ C23C 14/352 204/298.03 |
| 2007/0095651 | A1* | 5/2007 | Ye ............ C23C 14/225 204/192.1 |
| 2008/0164147 | A1* | 7/2008 | Dogi ............ C23C 14/3464 204/298.15 |
| 2008/0223715 | A1* | 9/2008 | Gibson ............ C23C 14/0078 204/192.13 |
| 2008/0286458 | A1 | 11/2008 | Kirchoff |
| 2009/0006574 | A1 | 1/2009 | Horvitz et al. |
| 2009/0236218 | A1 | 9/2009 | Teer |
| 2010/0183900 | A1* | 7/2010 | Wallin ............ H01J 37/3467 428/698 |
| 2014/0174912 | A1 | 6/2014 | Waught et al. |

FOREIGN PATENT DOCUMENTS

| | | |
|---|---|---|
| EP | 0992607 A1 | 4/2000 |
| EP | 0699245 B1 | 11/2001 |
| EP | 0892984 B1 | 9/2002 |
| GB | 2411290 A | 8/2005 |
| GB | 24112990 A | 8/2005 |
| GB | 2462890 A | 3/2010 |
| WO | WO 2004/029324 A1 | 4/2004 |
| WO | WO2004/029324 A1 | 4/2004 |
| WO | WO2006/032925 A1 | 3/2006 |
| WO | WO 2006/087558 A2 | 8/2006 |
| WO | WO2006/087558 A2 | 8/2006 |

OTHER PUBLICATIONS

CFM450 Reactive Closed field Magnetron Sputtering System, Applied Multilayers LLC, Dec. 31, 2009.
WIPO, U.S. International Search Authority, International Search Report and Written Opinion dated Jun. 10, 2016 in International Patent Application No. PCT/US2016/024287, 10 pages.
WIPO, International Preliminary Examining Authority (International Bureau of WIPO), International Preliminary Report on Patentability dated Dec. 10, 2013 in International Patent Application No. PCT/GB2012/051277, 9 pages.
WIPO, European International Search Authority, International Search Report and Written Opinion dated Jan. 22, 2013 in International Patent Application No. PCT/GB2012/051277, 14 pages.
Applied Multilayers LTD., "CFM450 Reactive Closed Field Magnetron Sputtering System," Retrieved Jul. 31, 2017 from the Internet: http://www.applied-multilayers.com/technical_downloads/CFM_450_System.pdf, 9 pages.
Gibson, D.R. et al., "Deposition of multilayer optical coatings using closed-field magnetron sputtering," *Proceedings of Spie*, vol. 6286, Jan. 1, 2006, 15 pages.

* cited by examiner

APPLICATION OF COATING MATERIALS

CROSS-REFERENCE TO RELATED APPLICATIONS

This application is the United States National Phase of PCT Patent Application No. GB2012/051277 filed on 7 Jun. 2012, which claims priority to British Patent Application No. 1109479.4 filed 7 Jun. 2011 and to British Patent Application No. 1205220.5 filed 26 Mar. 2012, each of which are incorporated herein by reference.

The invention to which this application relates is apparatus and a method for the application of coating materials onto one or more substrates. In particular, the apparatus is for use in relation to the deposition of coating materials onto one or more substrates, such as optical lens or electronic components, in order to provide the same with particular required characteristics.

The application of coating materials to optical lens to create a an anti reflective coating is well known but a common problem is providing the apparatus and the method in a format which allows the application of coatings which have a quality and lifetime which is acceptable for commercial use and at the same time apply the coatings in a manner which is easily repeatable, can be achieved in a relatively short time, and to provide the apparatus in a form which allows operation by personnel who are not required to be highly skilled. Conventionally it has been found that when relatively high speed coating operations have been attempted the coating quality has been inferior or cannot be achieved reliably and/or the apparatus has to be operated by skilled personnel. In use, there is a need to prevent the targets of material from becoming contaminated and therefore it is known to provide a multi-chamber arrangement which allows the coating chamber to be held constantly in vacuum and thereby minimise the possibility of contamination of the targets of material. There is also a need when such apparatus is used commercially and in particular, in the coating of optical lens in a commercial establishment such as a retail outlet, that the apparatus should be relatively fast in terms of the completion of a coating and also to be operable by relatively unskilled personnel, whilst ensuring the reliability of the quality of the coatings which are applied.

These problems, alone or in combination, have meant that the implementation of the apparatus and method in commercial premises such as high street optical outlets has been limited even though there is a known demand for the provision of optical lens with anti-reflective coatings applied thereto.

The aim of the present invention is therefore to provide apparatus and a method for the application of coatings to a substrate in a manner which renders the same capable of use in a commercial environment. A further aim of the present invention is to provide apparatus and, in particular, the means for holding substrates during the coating process in the apparatus in a manner which allows the efficient use of the apparatus and maintains the reliability of the coating which is applied to the substrates by the apparatus.

In a first aspect of the invention there is provided apparatus for the application of a coating to one or more substrates, said apparatus including a coating chamber in which there is provided one or more magnetrons with targets of material from which the coating is applied, carrier means for retaining one or more substrates thereon during the application of the coating to at least one surface thereof, means for rotating the said carrier during the coating process and wherein the carrier comprises a plurality of units, each of said units locating at least one substrate to be coated thereon and said units grouped together during the coating process to form said carrier.

In one embodiment the magnetrons are unbalanced magnetrons.

In one embodiment the power supply to at least one, but most typically, all of the magnetrons is a pulsed DC supply.

In one embodiment the carrier includes a plurality of locations for the receipt of one or more holders, each of said holders receiving a substrate to be coated therein. In one embodiment, portions of the carrier between the holder locations are formed or provided with members such that the same lie closer to an inner wall of the coating chamber than the portions of the carrier in which the holder locations are formed to create zonal coating areas, with one zone encouraging the application of material from a first target and another zone encouraging reaction of the material from the target with gases or ionised plasma to form a compound such as an oxide. In one embodiment the carrier is constructed without significant protrusions, such that the plasma generated by operation of the deposition magnetron can flow freely around the carrier in order to allow the completion of formation of compounds such as oxides while the substrates are rotated to face away from the deposition magnetron.

In one embodiment the carrier is substantially a regular polygon in section, such as a hexagon, and the faces of this polygonal prism are each provided for the receipt of a substrate or substrates. In a further embodiment, the carrier is made from an assembly of identical segments that, when loaded together into the coating machine, form a regular hexagonal or other regular polygonal prism. In both these embodiments the outer edges of the polygonal prism are arranged to be close to, but not touching, the internal generally cylindrical surface of the deposition chamber, such that the space around the carrier is largely separated into separate zones with one zone encouraging the deposition of material from a first target and another zone encouraging reaction of the material from the target with gases or ionised plasma to form a compound such as an oxide.

In one embodiment the magnetrons are provided with their respective polarities positioned such that a closed field configuration is created thereby encouraging the trapping of ionised plasma around the carrier and thereby encouraging the completion of reaction with plasma gases and/or the densification of material sputtered from the targets towards the carrier and hence substrates located thereon. In one embodiment magnet arrays may be located between the magnetrons so as to further encourage the creation of the closed field.

In one embodiment the coating chamber also includes at least one plasma source therein and means for selectively introducing one or more gasses into the coating chamber during the coating procedure.

In one embodiment a vacuum is created in the coating chamber during the coating process. Typically a loading chamber is provided in which the carrier is positioned to allow the placement and removal of substrates to and from the same in normal atmospheric conditions. When the loading chamber is exposed to the main coating chamber the same is held in vacuum and the passage between the main coating chamber and the loading chamber is closed prior to opening the loading chamber to atmospheric conditions.

In one embodiment masking means are provided between the external surface of at least one of the targets and the substrates held on the carrier. The location and shape of the masking means is such as to control the deposition of the material from the target onto the substrate in a desired manner. In one embodiment one or more of the masking means may be controlled from outside the vacuum chamber to alter the masking for substrates of different shapes (for example, concave or convex surfaces)

In one embodiment the substrates are cut or uncut optical lens and the coating which is applied is to create an anti reflective coating on at least one surface of the lens.

In a further aspect of the invention there is provided apparatus for the application of a coating to one or more substrates, said apparatus including a coating chamber in which there is provided one or more targets of material from which the coating is applied, carrier means for retaining one or more substrates thereon during the application of the coating to at least one surface thereof, means for rotating the said carrier during the coating process and wherein the carrier comprises a plurality of units, each of said units locating at least one substrate to be coated thereon and said units grouped together during the coating process to form said carrier.

Typically said units although grouped together to form the coating are not mechanically joined together to form the carrier.

In one embodiment, each of the units allows the location of two substrates at spaced locations thereon.

In one embodiment, each of the said locations is provided in an external face of the unit and said respective faces are angled in respect to each other.

In one embodiment, when the units are brought together, the carrier comprises a series of faces in a vertical plane, and preferably each of said faces includes location means for a substrate.

In one embodiment, the said units are brought together to form the carrier prior to the same entering the coating chamber. In one embodiment the said units are successively placed into a loading chamber to form the carrier therein. Alternatively the said units are placed together to form the carrier and the carrier is then moved into the loading chamber.

In one embodiment, the coating chamber is provided for selective communication with the loading chamber.

In one embodiment, the units can be selectively removed from, and placed in, the loading chamber to allow the removal and placement of substrates on the same following and prior to the coating operation or alternatively, the units can be retained within the loading chamber and the substrates removed from and placed onto the same while the units are in position in the loading chamber.

In one embodiment, the units are respectively located so as to form a carrier by placement of the units on a base and preferably on a base which is formed of, or has, an annular ring with a recess or protrusion with which location means in the form of the other of recesses or protrusions provided on the underside of the units, are located. Thus, when all the required units to form the carrier are placed in position on the base, the annular ring is covered by said units.

In one embodiment, the base is formed as an annular ring with an aperture in the centre to allow the reception of lifting means which engage with at least the underside of the carrier when formed to move the same between the loading chamber and coating chamber, typically in a substantially vertical direction.

Typically, the lifting means, when in position having moved the carrier into the coating chamber, seals an aperture in the coating chamber through which the carrier is moved.

When the carrier is loaded into the coating chamber, movement means are engaged with the carrier so as to cause rotation of the same and hence move the substrates thereon past the one or more coating materials as they are deposited from the respective targets and thereby form the coating on the substrates in the required manner.

In one embodiment, the movement means are located above the carrier such that when the carrier is moved into the position for coating it contacts the movement means. Typically a biasing force is provided to ensure engagement between the movement means and the carrier is achieved to thereby allow rotation of the same for the duration of the coating operation. In one embodiment the movement means comprise a biased, such as by spring loading, dog clutch to allow engagement with, and rotation of, the carrier.

Once the coating operation has been completed, the movement means are disengaged from the carrier and the lifting means serve to lower the carrier from the coating chamber into the loading chamber and thereby allow the unloading of the coated substrates from the carrier.

In one embodiment, a substrate is held in position with respect to an aperture provided in a carrier unit and, in one embodiment, the substrate locating means comprise a retaining ring which is located at the periphery of the substrate and which can be magnetically attached to one or more magnets located on the unit and thereby allow the location of the substrate in position on the unit.

In one embodiment, to the rear of the substrate, there is provided a biasing means which contacts with the rear face of the substrate and acts to bias the substrate towards the retaining ring thereby ensuring that the outer surface of the substrate is in the desired position for the application of coating material thereto and, preferably, minimise the potential for the passage of deposited material to the rear of the substrate.

Typically at least one of the targets includes a partially oxidised metal or metal alloy.

In a further aspect of the invention there is provided apparatus for the application of a coating onto at least one substrate, said apparatus including a coating chamber in which is provided a first magnetron with a target of a first material and a second magnetron with a target of a second material, a carrier mounted for rotation in said coating chamber, said carrier provided to receive and carry at least one substrate thereon and expose at least part of a surface of said at least one substrate for the application of material from the first and second targets thereon and wherein the material of at least one of the targets is a partially oxidised metal or metal alloy.

In one embodiment the said metal is any, or any combination of, Nb, Zr, Ti, Hf or Ta.

In one embodiment there is provided a target of Silicon.

In a further aspect of the invention, there is provided a carrier for a plurality of substrates, said carrier having a plurality of angled faces provided in a substantially vertically plane, at least some of said faces provided with location means to allow a substrate to be retained therewith and wherein the carrier is formed of a plurality of units which can be selectively separated to allow the handling of the same and brought together to form said carrier.

In a further aspect of the invention there is provided a method of coating a series of substrates in a coating chamber by the deposition of coating material thereon, said method comprising the steps of loading one or more substrates onto a carrier, with at least one surface of each substrate exposed to allow the application of the coating material thereto, said carrier initially being located in a loading chamber, creating a vacuum in the loading chamber with the carrier therein and creating a vacuum in the coating chamber, moving the carrier from the loading chamber into the coating chamber, rotating the carrier, applying material from one or more deposition means in the coating chamber onto the substrates to form the coating, removing the carrier from the coating chamber into the loading chamber, removing the coated substrates therefrom and wherein the carrier is formed from a plurality of units, each of said units provided with means to allow the location of at least one substrate thereon, and said units are brought together and retained together to form the carrier.

In one embodiment, the said units are held together by placement of locations means provided on the said units with location means provided on a base on which the carrier is supported.

In one embodiment, the said location means are an annular ring.

In a further aspect of the invention there is provided a method of applying a coating onto a surface of at least one substrate, said method comprising the steps of placing said at least one lens onto a carrier held in a coating chamber, creating a vacuum in the coating chamber, sputter depositing a material from a target of a first magnetron onto the substrate surface to create an adhesion layer and thereafter selectively depositing material from said target of the first magnetron and from a target of at least one further magnetron to create the coating and wherein the material of the said at least one further magnetron is an at least partially oxidised metal or metal alloy.

Specific embodiments of the invention are now described wherein.

Figure 2:
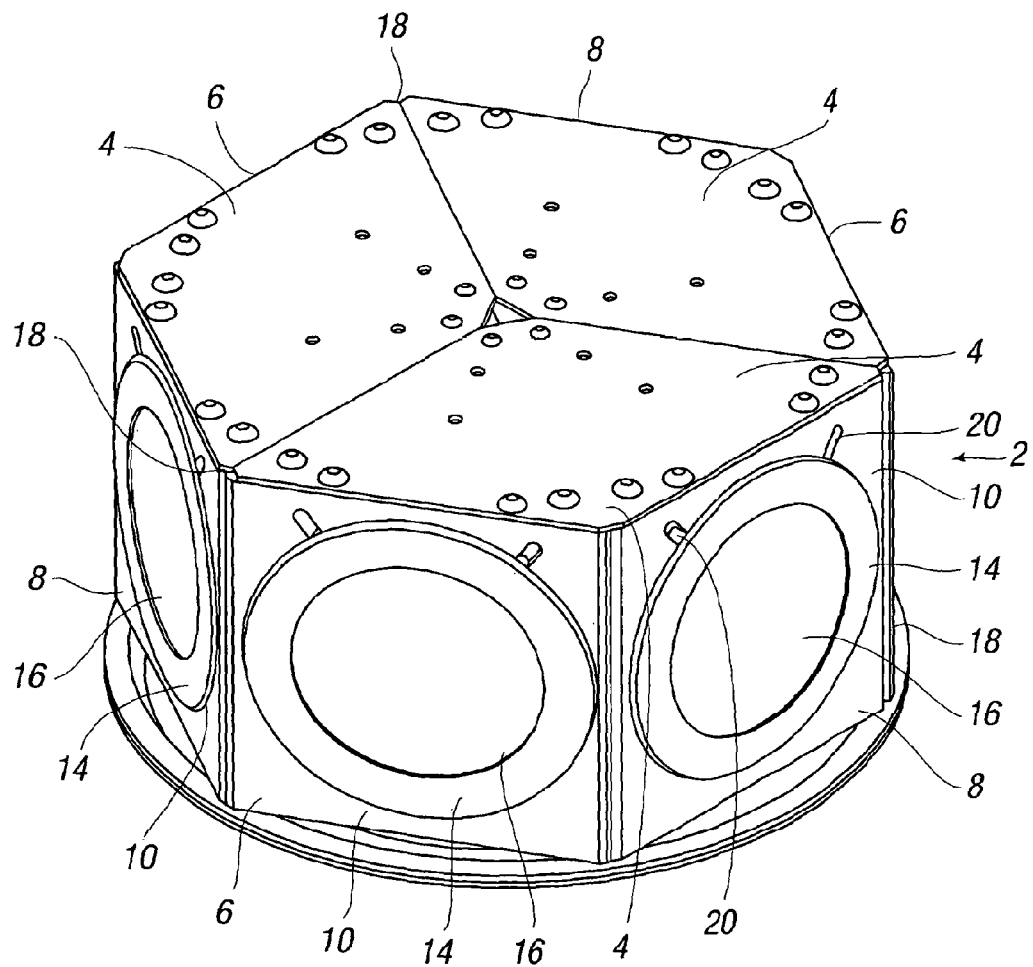
FIG. 2 illustrates the carrier of FIG. 1.

Referring firstly to FIG. 2 there is illustrated a carrier 2 in accordance with one embodiment of the invention. The carrier is formed for ma number of units 4 each of which, in this embodiment has two angled, substantially vertical, faces 6,8, each of which have location means 10 in the form of an aperture and retaining ring 14 located around the periphery thereof, to locate a substrate 16 in position. It will be seen therefore how the carrier 2 is formed, in this embodiment, from three units 4 which are located as shown and preferably at the interface 18 between the respective units there is an overlap so as to form a partial seal between the units and prevent the progression of deposited material into the interior of the carrier.

In one embodiment the retention ring 14 is provided with a magnetic material therein which allows the same to be magnetically held in position over the aperture and thereby retain the substrate in position, by one or more magnets (not shown) provided in the unit adjacent the aperture. Grooves 20 or other means are provided to allow the insertion of a tool to allow the release of the retention rings from the units in order to remove the substrates once coated.

Figure 3:
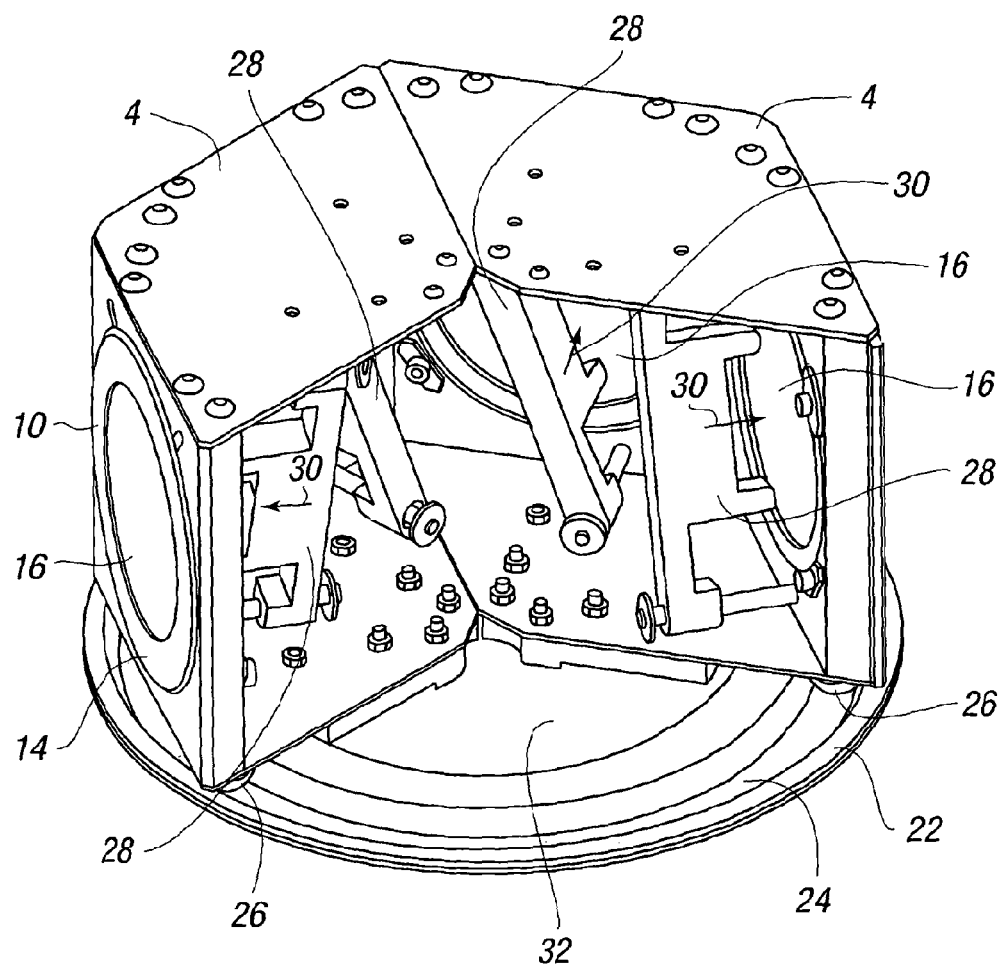
FIGS. 3 and 4 illustrate views of the carrier of FIGS. 1 and 2 partially formed.
Figure 4:
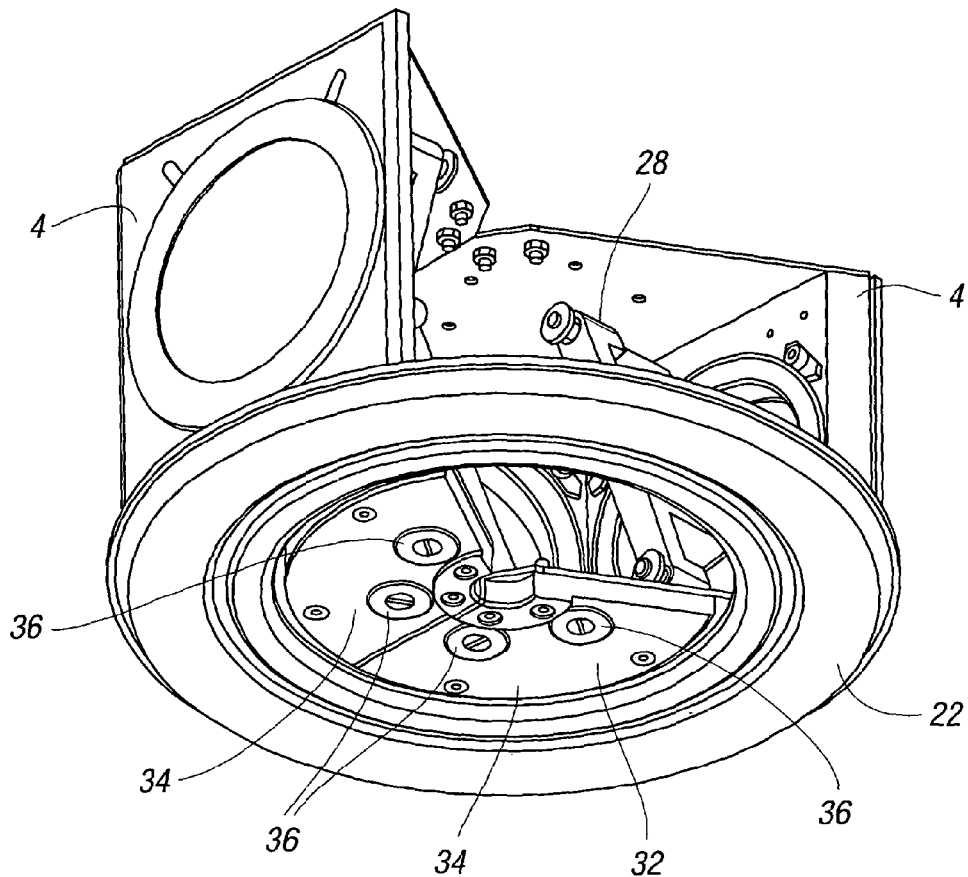
Figure 5:
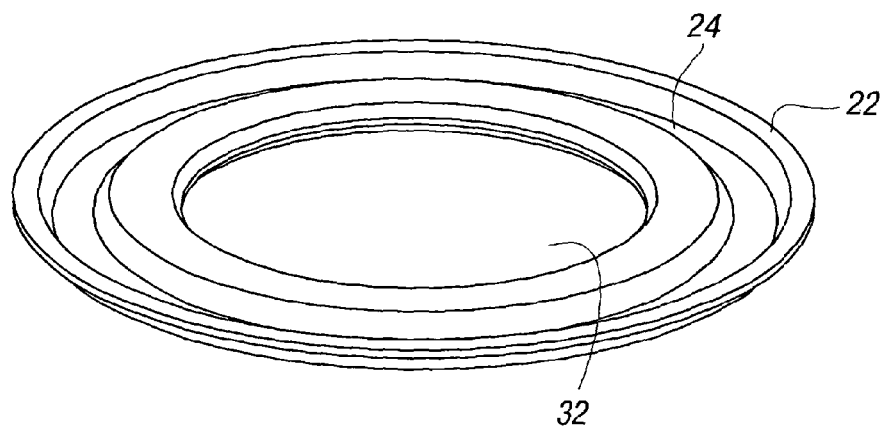
FIG. 5 illustrates a base on which the carrier is formed and supported.
Figure 6:
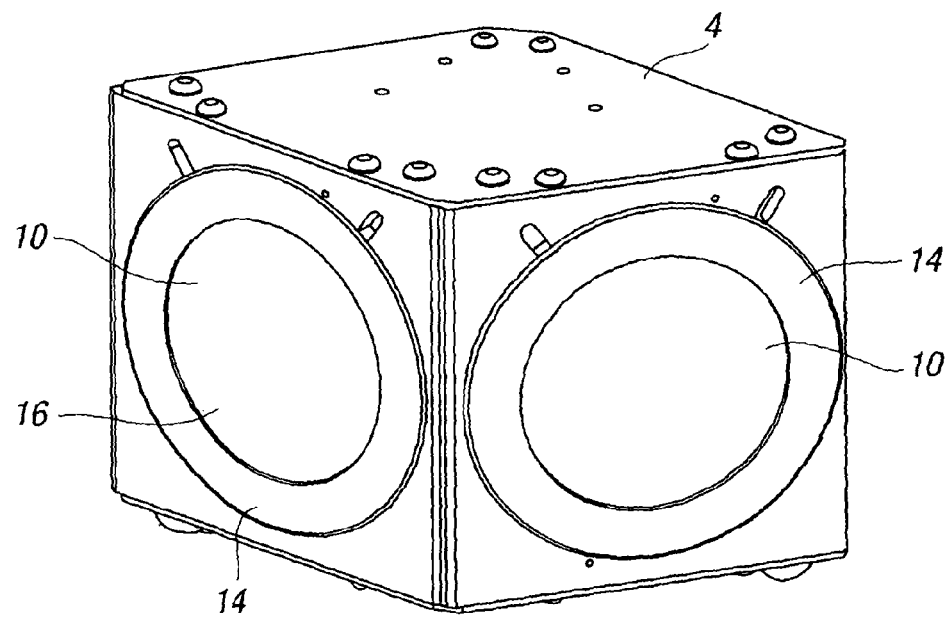
FIGS. 6 and 7 illustrate one of the units used to form the carrier in accordance with the invention.
Figure 7:
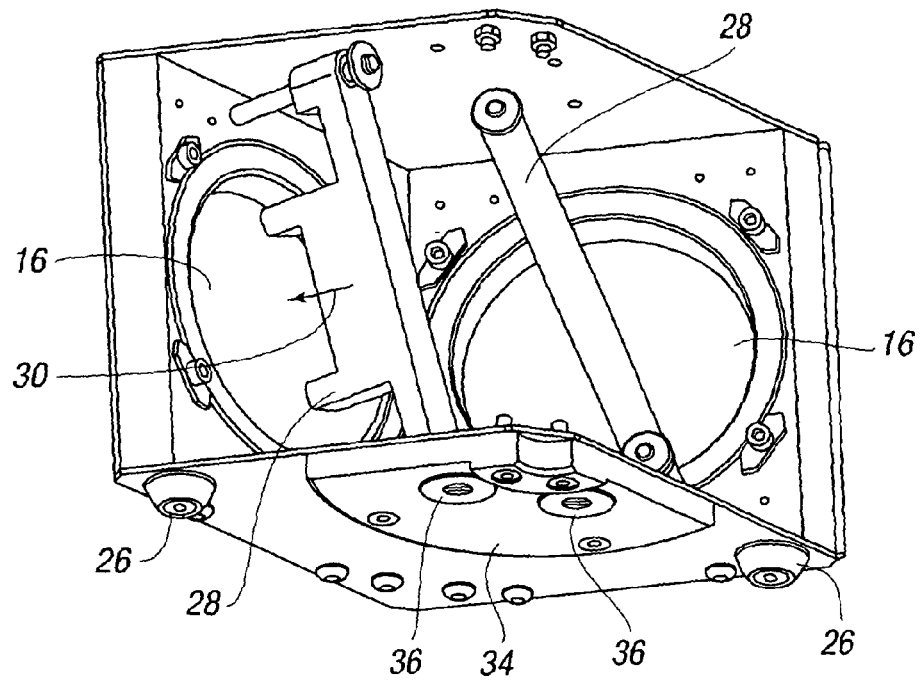

FIGS. 3 and 4 illustrate the carrier of FIG. 2 when partially formed by two units 4 and show that the units are located on an annular base 22 as shown in FIG. 5 which has a recess or channel 24 into which locating protrusions 26 provided on the underside of the units are placed to thereby retain the respective units in location and hence allow the carrier to be formed. The base 22 is not, and does not need to be, rotated along with the carrier during the coating operation on the substrates and the base is provided with a central aperture 32 which allows a portion of the underside 34 of each of the units to be exposed and to allow magnets 36 to be exposed to allow the same to engage with lifting means which will be described subsequently.

Also shown in the FIGS. 3,4,6 and 7 are biasing means 28 which are provided for each substrate location and which are biased in the direction of arrow 30 to act against a respective substrate at that location in order to move the substrate into tight contact with the retention ring 14.

Figure 1:
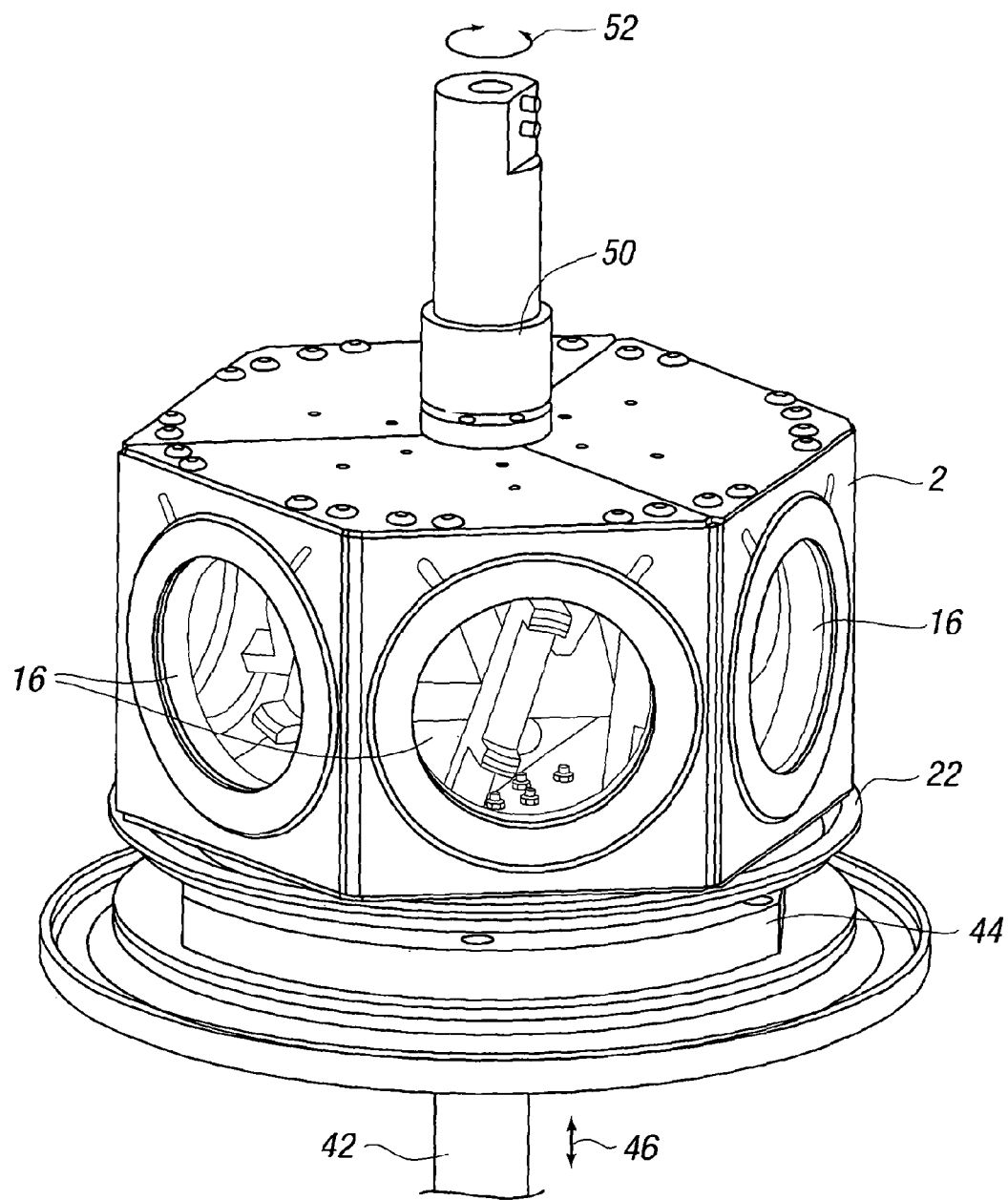
FIG. 1 illustrates a carrier in accordance with one embodiment of the invention in engagement with movement means.
Figure 8:
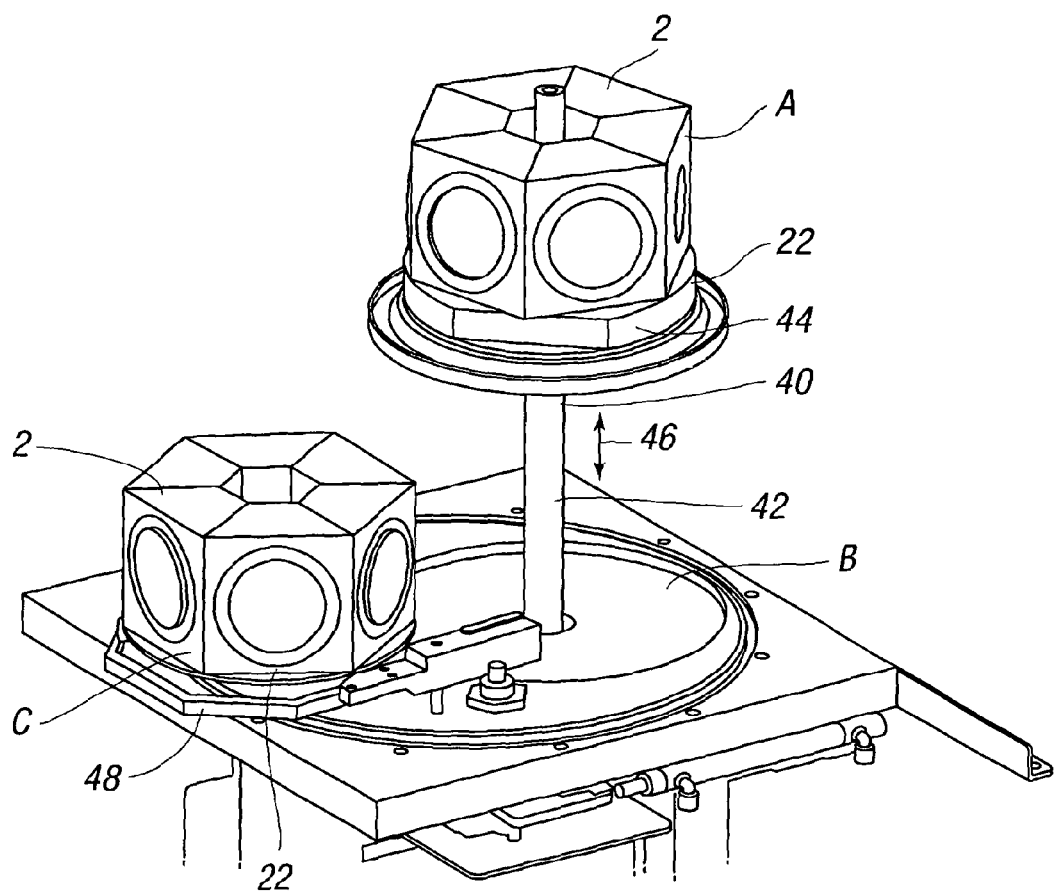
FIG. 8 illustrates the movement of the carrier of FIGS. 1-7 between the loading and coating chambers.

Turning now to FIGS. 1 and 8 the use of the carrier formed in accordance with FIGS. 2-7 is illustrated. The carrier 2 is shown mounted on the base 22 in FIG. 1 and being supported by lifting means 40 which comprises a movement ram 42 and a plate 44 a rotatable part of which contacts with the exposed portions 34 of the carrier units to locate thereon via the magnets 36. The lifting means is movable in the direction of arrow 46 to raise and lower the carrier and base into and from the coating chamber (not shown) but indicated as position A in FIG. 8 and downwardly to lie in position B in a loading chamber (not shown).

In FIG. 8 the carrier is also shown in position C which is in the loading chamber but offset to the movement axis of the lifting means 40 and adjacent to an access door into the loading chamber to allow substrates and/or carrier units carrying the substrates, to be inserted into or removed from the loading chamber. At this location in one embodiment the units 4 can be located on the annular base and moved by arm 48 into position B. However, in another embodiment, the annular base 22 can stay in the position B in the loading chamber and the units 4 can be moved into position on the annular base. When the carrier is formed by the units in position B with the substrates located thereon, the lifting means 40 are moved upwardly to move the carrier and substrates to position A in the coating chamber. The top of the carrier is then contacted and engaged with movement means 50 which can then be rotated as indicated by arrow 52 and hence rotate the carrier during the coating process in the coating chamber. The carrier is rotatable on the plate 44 which is fitted with a rotatable turntable on its top and it is this part which contacts the underside of the carrier units, thereby allowing the assembled carrier to be rotatable.

Once the coating has been applied to the substrates, the carrier is disengaged from the movement means 50 and the lifting means 40 are used to lower the carrier out of the coating chamber and into the loading chamber under vacuum such that the coated substrates can then be removed from the carrier in position B or C as appropriate for the particular embodiment.

Figure 9:
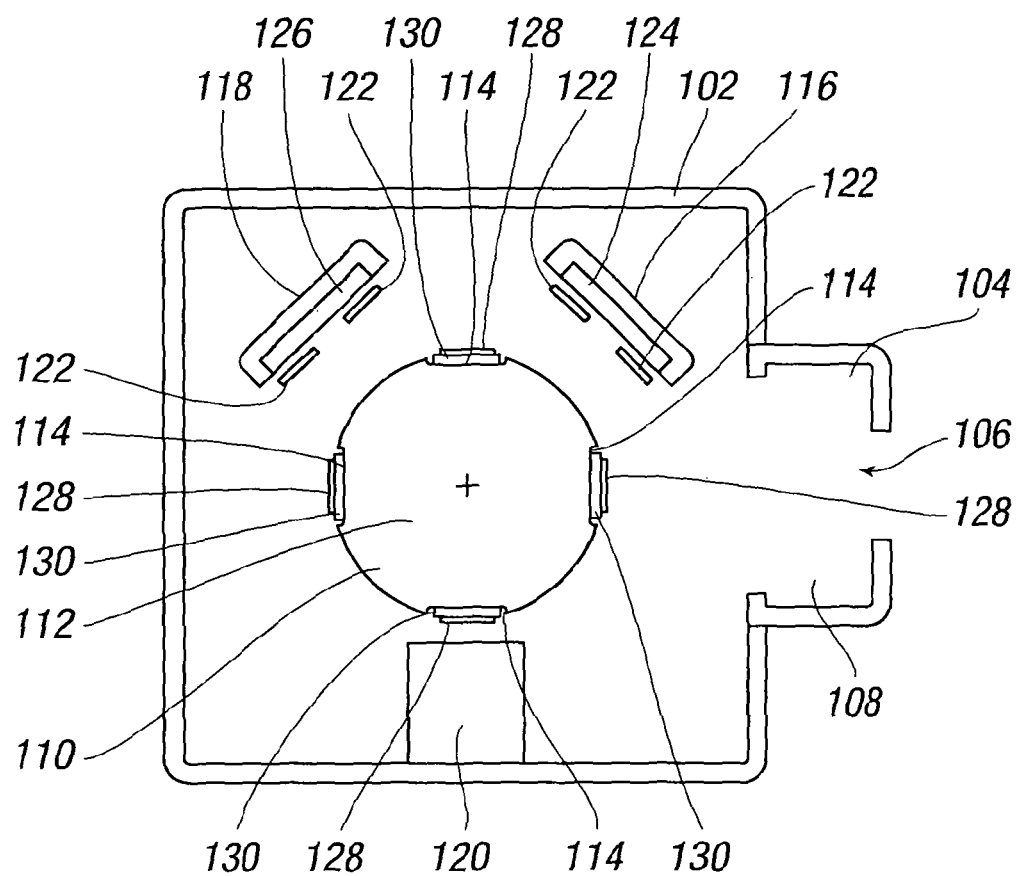
FIG. 9 illustrates a plan view of one embodiment of apparatus in accordance with the invention.

Referring now to FIG. 9 there is illustrated apparatus in accordance with the current invention in another embodiment. The apparatus includes a coating chamber 102 in which is created a vacuum during the coating process at least. In order to prevent the chamber 102 from being exposed to atmosphere in use and hence preventing possible contamination of the targets if the magnetrons provided therein, a loading chamber 104 is provided in communication with the coating chamber 102. This allows the substrate and carrier 110 to be placed into the loading chamber 104 from atmosphere through opening 106, for the opening to then be closed and a vacuum created in the loading chamber via a rotary pump or other suitable vacuum pump. When vacuum has been created the opening 108 into the chamber 102 can be opened and the carrier with substrates placed thereon is moved into position for rotation about axis 112 in the coating chamber 102 in which the vacuum has already been created by the use of a turbo molecular pump. The opening 108 is then closed. The reverse procedure is followed when removing the carrier from the coating chamber 102 and the substrates from the carrier 10 when in the loading chamber 104. This reduces particles in the coating chamber 102 and contamination by water or other vapours and in turn decreases the time for application of the coating onto the substrates in the coating chamber 102.

In one embodiment a variable baffle may be provided to allow full pumping speed to be achieved when the substrates have been introduced into the coating chamber 102 and a reduction in the pumping speed when the gases which are used during the application of the coating are introduced at relatively high pressures.

Preferably the coating chamber is fabricated from solid aluminium in order to avoid the possibility for leakage from any welded joints which would be necessary if the multiple parts were to be used. In one embodiment a Meissner trap may be used to substantially eliminate water vapour in the coating chamber.

The carrier 110 is typically substantially circular with faces 114 formed at spaced intervals each provided for the receipt of a substrate therewith. Once positioned in the coating chamber 102 the carrier is provided for rotation, typically at a speed in the range of 30-100 rpm about the axis 112 which is typically a vertical axis. The carrier is held on an insulating material to allow the same to be electrically floating within the plasma which is created by the magnetrons 116, 118 and/or plasma source 120 which are spaced apart in the coating chamber as shown. The rotation of the carrier is found to achieve good uniformity of coating in the horizontal direction i.e. perpendicular to the axis 112 and in order to improve the uniformity of the coating in the vertical direction, i.e parallel with the axis 112, masking means 122 are located intermediate the respective magnetron targets 124,126 and the substrates 128 held on the carrier. Each of the masking means includes an aperture through which the material which is sputter deposited from the magnetron targets can pass and while the shape of the aperture is typically elongate the specific shape and dimensions can be selected to suit particular coating forming requirements. The masking means can also, in one embodiment, be provided to be electrically floating.

In one embodiment, as shown, the substrates, typically uncut lenses, are each held on a respective holder 128 which is in turn located with the carrier. The holders can accommodate a range of different lens sizes by forming a container with which the lens is located. The container typically includes one or more means to allow any trapped gas to exit the holder. The containers can also be insulated to prevent electrical conduction across the carrier 10 and thereby minimise arcing and minimise the possibility of the condition of one side of the carrier affecting the condition of the opposing side of the carrier. Further steps can also be taken to insulate components of the coating chamber and means for use therewith in order to further reduce the possibility of uncontrolled electrical discharge.

The coating chamber 102 in this embodiment includes two magnetrons 116,118 with targets of material 124, 126 respectively. The material of target 124 is a partially oxidised high index metal or metal alloy such as NbOx and the material of target 126 is a low index material such as Si. In this case both magnetrons are unbalanced and provided with a pulsed DC power supply which is found to reduce the propensity of arcing occurring. In one arrangement the magnetrons are arranged such that they have opposing polarity configurations so as to enhance the plasma density within the coating chamber 102. The plasma may also be generated from a magnetically enhanced or other plasma source 120 which typically operates when gases such as Argon and/or oxygen are introduced into the coating chamber and can be initially used in the coating process to create a cleaning effect on the targets 124, 126 and/or create surface activation. Thereafter the plasma source can be used with oxygen gas introduced into the coating chamber to fully oxidise the material deposited from the partially oxidised metal or metal alloy target and to oxidise the layers of silicon which are deposited from the silicon target.

The power applied by a pulsed DC power supply to the magnetrons targets, is controlled as this, in combination with the time for which power is applied, is used to determine the thickness of each optical layer of the coating which is applied to the substrate. Generally the power level in coating systems is kept as high as practical in order to reduce the deposition time. An important aspect of the present invention is to selectively operate the power supply at a reduced power level during the deposition of the beginning, end or within some of the layers of the coating, such as the beginning of a silica layer deposited on a niobia layer, as this has been found advantageous in making the improved optical films with, in this example, reduced absorption of transmitted light.

It is important to control the partial pressures of the gases introduced into the coating chamber 102 as this can influence the morphology of the coating layers as they are created and the subsequent stress and mechanical behaviour of the coating which is applied. Typically the partial pressures are controlled by use of mass flow controllers.

Preferably the overall control of the apparatus can be achieved with user interaction via a touch screen interface to a computer or programmable logic controller thereby increasing the possibility of the apparatus being controlled by semi skilled personnel.

An example of an antireflection coating which can be applied using the apparatus of the invention is provided below which uses targets of NbOx and Si and the layers are indicated in succession upwardly from the lens substrate surface with the layer of Si O2 in each case forming the external surface of the anti reflective coating which is formed.

AIR
$SiO_2$: 82.51 nm
niobia: 113.1 nm
$SiO_2$: 30.48 nm
niobia: 11.33 nm
Adhesion layer: $SiO_x$ typically 0.5-2 nm
LENS SUBSTRATE As well as depositing antireflection coatings, by modifying the thicknesses of the layers other coatings with enhanced reflection (mirror coatings) can also be produced if so desired.

The substrates to which coatings are applied using the apparatus can be selected from any of, spectacle lens, skiwear or sunwear glasses, and indeed any glass, plastic, polymer or semi conductor surfaces.

While the invention has been described with a certain degree of particularity, it is manifest that many changes may be made in the details of construction and the arrangement of components without departing from the spirit and scope of this disclosure. It is understood that the invention is not limited to the embodiments set forth herein for purposes of exemplification, but is limited only by the scope of the attached claims, including the full range of equivalency to which each element thereof is entitled.

The invention claimed is:

1. An apparatus for the application of a coating to one or more substrates, said apparatus comprising:
   a coating chamber having a generally cylindrical interior surface and one or more magnetrons with targets of material from which the coating is formed; and
   a plurality of carrier units, each unit of the plurality of carrier units comprising an aperture and a substrate holder that receives a substrate and retains the substrate within the aperture during the application of the coating to at least one surface thereof,
   each carrier unit of the plurality of carrier units separable with one another, the plurality of carrier units assembled together to form a carrier having a polygonal shape;
   portions of an exterior surface of the carrier between the substrate holders positioned closer to the interior surface of the coating chamber relative to the substrate holders when the carrier is positioned within the coating chamber.

2. The apparatus according to claim 1 wherein the one or more magnetrons are unbalanced magnetrons.

3. The apparatus according to claim 1 wherein, when the carrier is positioned within the coating chamber, a plurality of distinct coating areas are formed within the coating chamber, the plurality of distinct coating areas comprising a first area encouraging deposition of material from a first target and a second area encouraging reaction of the material from the first target to form an oxide.

4. The apparatus according to claim 1 wherein the one or more magnetrons have an opposing polarity configuration.

5. The apparatus according to claim 1 wherein the coating chamber includes at least one plasma source therein and a controller that introduces one or more gasses into the coating chamber during the coating procedure.

6. The apparatus according to claim 1 further comprising a loading chamber positioned to allow placement and removal of the carrier to and from the loading chamber while the coating chamber is held in vacuum.

7. The apparatus according to claim 1 wherein the coating chamber comprises an aperture between an external surface of at least one of the targets and the one or more substrates retained on the carrier.

8. The apparatus according to claim 1 wherein the polygonal shape of the carrier comprises a hexagon having one substrate holder positioned in each planar vertical face of the hexagon and the portions of the exterior surface of the carrier between the substrate holders that are positioned closer to the interior surface of the coating chamber relative to the substrate holders of the carrier when the carrier is positioned within the coating chamber defined by intersections of planar vertical faces of the hexagon with one another.

9. The apparatus according to claim 1 wherein the plurality of carrier units comprises three separable, identical carrier units.

10. The apparatus according to claim 1 further comprising an annular ring with a recess or a protrusion complementary to a recess or a protrusion provided on an underside of the carrier.

11. The apparatus according to claim 10 wherein a lift engages at least an underside of the carrier through an aperture of the annular ring.

12. The apparatus according to claim 11 wherein the lift comprises a plate that pneumatically seals an aperture of the coating chamber through which the carrier is moved by the lift.

13. The apparatus according to claim 12 further comprising a rotatable shaft that engages and rotates the carrier within the coating chamber.

14. The apparatus according to claim 13 wherein the rotatable shaft is located above the carrier such that when the carrier is moved into a position for coating it contacts the rotatable shaft.

15. The apparatus according to claim 14 wherein when a coating operation has been completed, the rotatable shaft is disengaged from the carrier and the lift lowers the carrier from the coating chamber into the loading chamber and thereby allows transfer of the carrier from the lift to a transfer arm.

16. The apparatus according to claim 1 wherein the substrate holder is magnetically held in position over the aperture.

17. The apparatus according to claim 1 wherein at least one of the targets is a metal or metal alloy.

18. An apparatus for the application of a coating onto at least one substrate, said apparatus comprising:
    a coating chamber having a first magnetron with a first target and a second magnetron with a second target;
    an aperture formed through a bottom of the coating chamber;
    a plate coupled to a lift positioned below the aperture, the plate positioned to close the aperture formed in the bottom of the coating chamber when the lift is extended upwards; and
    a carrier rotatably mounted on the plate, the carrier comprising substrate holders.

19. The apparatus of claim 1 further comprising a pulsed DC power supplied to at least one of the one or more magnetrons.

20. The apparatus of claim 1 wherein the carrier is hexagonal.

21. The apparatus of claim 1 wherein the portions of the exterior surface of the carrier between the substrate holders partially isolate reactive gases between different substrate holders of the carrier and a wall of the coating chamber.

22. The apparatus of claim 12 further comprising a transfer arm that transfers the carrier to and from the plate of the lift.

23. The apparatus of claim 18 wherein the carrier is rotatably mounted on the plate relative to the lift.

* * * * *